(12) United States Patent  (10) Patent No.: US 7,710,531 B2
Kurokawa et al.  (45) Date of Patent: May 4, 2010

(54) LIQUID CRYSTAL DISPLAY APPARATUS

(75) Inventors: Kazumasa Kurokawa, Kariya (JP); Yoshimi Kondo, Anjo (JP); Hirokazu Shibata, Okazaki (JP)

(73) Assignee: DENSO CORPORATION, Kariya (JP)

( * ) Notice: Subject to any disclaimer, the term of this patent is extended or adjusted under 35 U.S.C. 154(b) by 921 days.

(21) Appl. No.: 11/353,954

(22) Filed: Feb. 15, 2006

(65) Prior Publication Data
US 2006/0181670 A1 Aug. 17, 2006

(30) Foreign Application Priority Data

Feb. 15, 2005 (JP) .............................. 2005-037642
Feb. 15, 2005 (JP) .............................. 2005-037643
Feb. 15, 2005 (JP) .............................. 2005-037644

(51) Int. Cl.
G02F 1/1333 (2006.01)
(52) U.S. Cl. .................... 349/161; 349/65; 349/149
(58) Field of Classification Search .................. 349/161
See application file for complete search history.

(56) References Cited

U.S. PATENT DOCUMENTS

| 6,275,211 | B1 | 8/2001 | Flannery | |
| 6,556,258 | B1 * | 4/2003 | Yoshida et al. | 349/61 |
| 7,126,650 | B2 * | 10/2006 | Nagahama | 349/58 |
| 7,275,851 | B2 | 10/2007 | Sakurai | |
| 2002/0113919 | A1 * | 8/2002 | Liu et al. | 349/65 |

FOREIGN PATENT DOCUMENTS

| JP | A-59-097459 | 6/1984 |
| JP | 05-259326 | 10/1993 |
| JP | H06-46177 | 6/1994 |
| JP | A-9-126669 | 5/1997 |
| JP | A-10-333129 | 12/1998 |
| JP | 11-202800 | 7/1999 |
| JP | 2001-059961 | 3/2001 |
| JP | A-2002-91330 | 3/2002 |
| JP | 2002-216525 | 8/2002 |

(Continued)

OTHER PUBLICATIONS

Japanese Office Action examination report and citation mailed May 13, 2008 issued in corresponding JP application No. 2005-037644 with English translation.

(Continued)

Primary Examiner—Richard H Kim
(74) Attorney, Agent, or Firm—Nixon & Vanderhye, PC

(57) ABSTRACT

A liquid crystal display apparatus includes a light source, a light source drive circuit for switching the light source on and off, a heat release member for releasing heat generated by at least one of the light source drive circuit and the light source, and a heat transport member for transporting the heat to the heat release member. The light source drive circuit is connected to the heat release member through the heat transport member. The heat transport member has high heat conductivity so that a large part of the heat can be transferred to the heat release member through the heat transport member for a short time. Thus, the heat transport member prevents the heat from affecting components disposed near the light source drive circuit or the light source.

15 Claims, 14 Drawing Sheets

FOREIGN PATENT DOCUMENTS

| | | |
|---|---|---|
| JP | A-2004-037681 | 2/2004 |
| JP | 2004-171948 | 6/2004 |
| JP | 2004-279262 | 10/2004 |
| JP | 2004-283304 | 10/2004 |

OTHER PUBLICATIONS

Japanese Office Action mailed Aug. 19, 2008, issued in corresponding JP Application No. 2005-037642 with English translation.

Japanese Office Action mailed Aug. 19, 2008, issued in corresponding JP Application No. 2005-037643 with English translation.

Japanese Office Action mailed Sep. 24, 2008, issued in counterpart Japanese Application No. 2005-37644, with English translation.

Japanese Office Action mailed Apr. 15, 2008 issued in corresponding Japanese Application No. 2005-037642 with English translation.

* cited by examiner

US 7,710,531 B2

LIQUID CRYSTAL DISPLAY APPARATUS

CROSS REFERENCE TO RELATED APPLICATION

This application is based on Japanese Patent Applications No. 2005-37642 filed on Feb. 15, 2005, No. 2005-37643 filed on Feb. 15, 2005, and No. 2005-37644 filed on Feb. 15, 2005, the disclosures of which are incorporated herein by reference.

FIELD OF THE INVENTION

The present invention relates to a liquid crystal display apparatus for performing a display, which is suitably used for a vehicle, for example.

BACKGROUND OF THE INVENTION

FIG. 20 is a cross-sectional view showing a liquid crystal display (LCD) apparatus disclosed in JP-A-2004-279262. The LCD apparatus includes a liquid crystal display member J1, an optical member J2 (e.g., an optical sheet and a diffusion sheet) disposed behind the liquid crystal display member J1, a light-emitting diode (LED) J3 as a light source element, a circuit board J4 having a LED drive circuit, a LED control circuit and a liquid crystal drive circuit, a light guide plate J5 as a light waveguide path for guiding light emitted by the LED 3, a reflector plate J6 for directing light to the front surface of the light guide plate J5.

The LED drive circuit has a switching element for switching the LED J3 on and off. The LED control circuit is for controlling timing of the switching on and off of the LED J3. The liquid crystal drive circuit is for driving the liquid crystal display member J1.

In the LCD apparatus, the LED J3 emits light at the timing controlled by the LED control circuit. The emitted light is introduced into the light guide plate J5 through the end surface. The introduced light is directed to the front surface of the light guide plate J5 by the reflector plate J6 disposed behind the light guide plate J5. Thus, the directed light is applied to the back surface of the liquid crystal display member J1 disposed in the front of the light guide plate J5. Therefore, when the liquid crystal drive circuit drives the liquid crystal display member J1, a display appears on the liquid crystal display member J1.

When the display is performed on the liquid crystal display member J1, the LED drive circuit for driving the LED J3 generates heat. For example, the switching element of the LED drive circuit generates heat. If the generated heat is transferred to components deposed near the LED drive circuit, the heat may affect the components. For example, if the heat is transferred to the light guide plate J5 made of acrylic susceptible to heat, the light guide plate J5 may be deformed. If the heat affects a complicated circuit such as the liquid crystal drive circuit for driving the liquid crystal display member J1, a wrong display may appear on the liquid crystal display member J1.

In order to prevent the problem, the circuit board J4 having the LED drive circuit is connected with a metal heat release plate extending to the back of the LCD apparatus far away from the circuit board J4. The heat release plate serves as a cooling module and releases the heat at the back of the LCD apparatus.

However, the heat release plate has high heat resistance, because the heat release plate is directly jointed to the circuit board J4. Further, the heat release plate is connected to the circuit board J4 in a wide area so that the heat tends to spread widely around the LED drive circuit. Therefore, a large portion of the heat generated by the LED drive circuit is released near the LED drive circuit and affects the components disposed near the LED drive circuit.

In the display apparatus, although the heat release plate extends to the back of the display apparatus, the heat release plate cannot fully transport the heat to the back of the display apparatus due to the high heat resistance and the wide shape. Therefore, a large portion of the heat generated by the LED drive circuit is released near the LED drive circuit. Consequently, the components disposed near the LED drive circuit may be subjected to high temperature.

SUMMARY OF THE INVENTION

In view of the above described problem, it is an object of the present invention to provide a liquid crystal display (LCD) apparatus in which heat generated by a drive circuit is prevented from being transferred to a component disposed near the drive circuit.

A liquid crystal display apparatus includes a liquid crystal member for performing a display, a light source for emitting a light, a light guide plate for guiding the light emitted by the light source to the liquid crystal member, a circuit board having a liquid crystal display circuit for driving the liquid crystal member, a light source drive circuit for switching the light source on and off, a heat release member for releasing a heat generated by the light source drive circuit, and a heat transport member having a heat conductivity higher than the heat release member.

The heat release member is connected to the light source drive circuit or a light source at a position separated from the light source drive circuit or the light source. A large portion of the heat generated by the light source drive circuit or the light source is transported from the light source drive circuit or the light source to the heat release member without being released in the heat transport member, because the heat transport member has the higher heat conductivity.

Thus, the heat transport member prevents the heat from being transferred to components such as the light guide plate and the liquid crystal drive circuit of the circuit board, which are susceptible to heat and disposed near the light source drive circuit or the light source. In the LCD apparatus, therefore, it is possible to prevent the heat from causing problems such as deformation of the light guide plate and a wrong display appearing on the liquid crystal member.

For example, the heat transport member has an extension portion extending to a predetermined position next to or behind the liquid crystal member, and the heat release member is connected to the extension portion of the heat transport member to be disposed at the predetermined position. Alternatively, the heat release member can be disposed at or above a position where the light guide plate and the circuit board are disposed. Furthermore, the heat transport member can be constructed with at least one of a heat pipe, a metal plate, and a conductive member having a carbon sheet or resin.

In addition, the heat release member can be provided with a plurality of fins which are arranged parallel to each other to be spaced apart from each other and extend in a vertical direction. Alternatively, the heat release member includes a heat release plate disposed behind the liquid crystal member and the light guide plate. In this case, the heat release plate is provided to form a part of a case for protecting at least the light guide plate, and the heat transport member is disposed along the case to contact the heat release plate.

The heat transport member can be a heat pipe for transporting the heat to the heat release member. In this case, the heat pipe has a first end portion bent upwardly and connected to the heat release member, and a second end portion disposed below the first end portion and connected to the light source drive circuit or the light source. Furthermore, the heat pipe can be sealed with a liquid medium. In this case, the second end portion of the heat pipe is bent upwardly, so that the liquid medium is positioned in a portion between and under the first and second end portions of the heat pipe.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

A LCD apparatus 100 of the first embodiment will be now described with reference to FIGS. 1 to 4. The LCD apparatus 100 may be, for example, used as a display apparatus for a navigation system or an indicator such as a speed meter and a tachometer arranged in an instrument panel of a vehicle.

Figure 1:
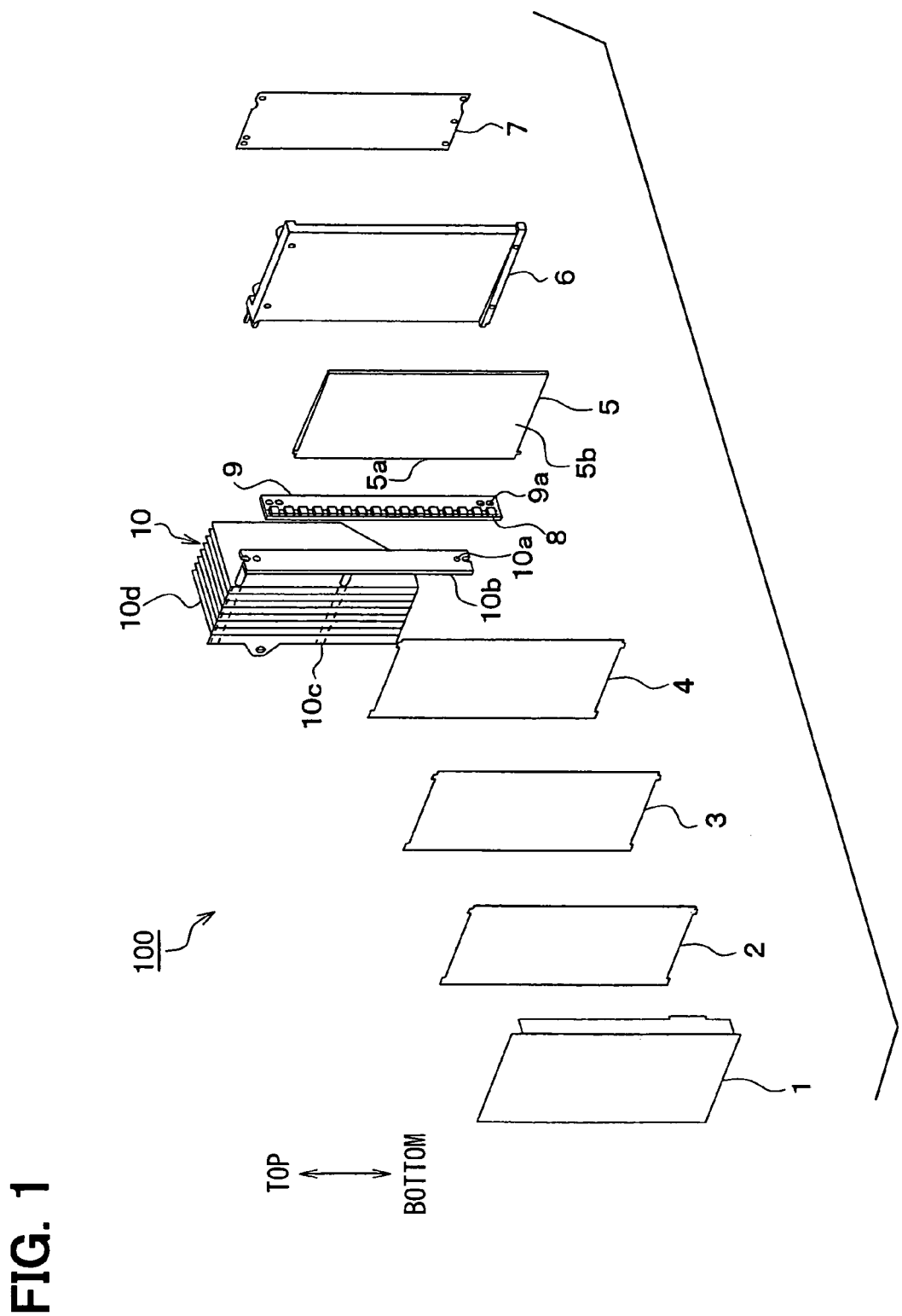
FIG. 1 is a disassembled perspective view showing a portion of a liquid crystal display apparatus according to a first embodiment of the present invention.

As shown in FIG. 1, the LCD apparatus 100 includes a liquid crystal panel 1, optical sheets 2, 3, a diffusion sheet 4, a light guide panel 5, a reflector panel 6, a circuit board 7, a light emitting diode (LED) 8, a LED drive circuit 9, and a cooling module 10.

The liquid crystal panel 1 is a well-known thin film transistor (TFT) liquid crystal panel. The optical sheets 2, 3, the diffusion sheet 4, the light guide panel 5, the reflector panel 6, and the circuit board 7 are disposed in this order behind the liquid crystal panel 1 and held in a cover 11 shown in FIG. 2.

The optical sheets 2, 3 are laminated into single sheet. The single sheet reflects light entering the single sheet through the back surface (i.e., from the right side of FIG. 3) at an incident angle perpendicular to the back surface, thereby preventing the light from passing through the single sheet. In contrast, the single sheet refracts light entering the single sheet through the back surface at a predetermined incident angle so that the incident light can pass through the single sheet. Specifically, the optical sheets 2, 3 are laminated together in such a manner that the optical sheet 2 refracts light entering the optical sheet 2 at a first incident angle and the optical sheet 3 refracts light entering the optical sheet 3 at a second incident angle that is different from the first incident angle by 90°.

Figure 3:
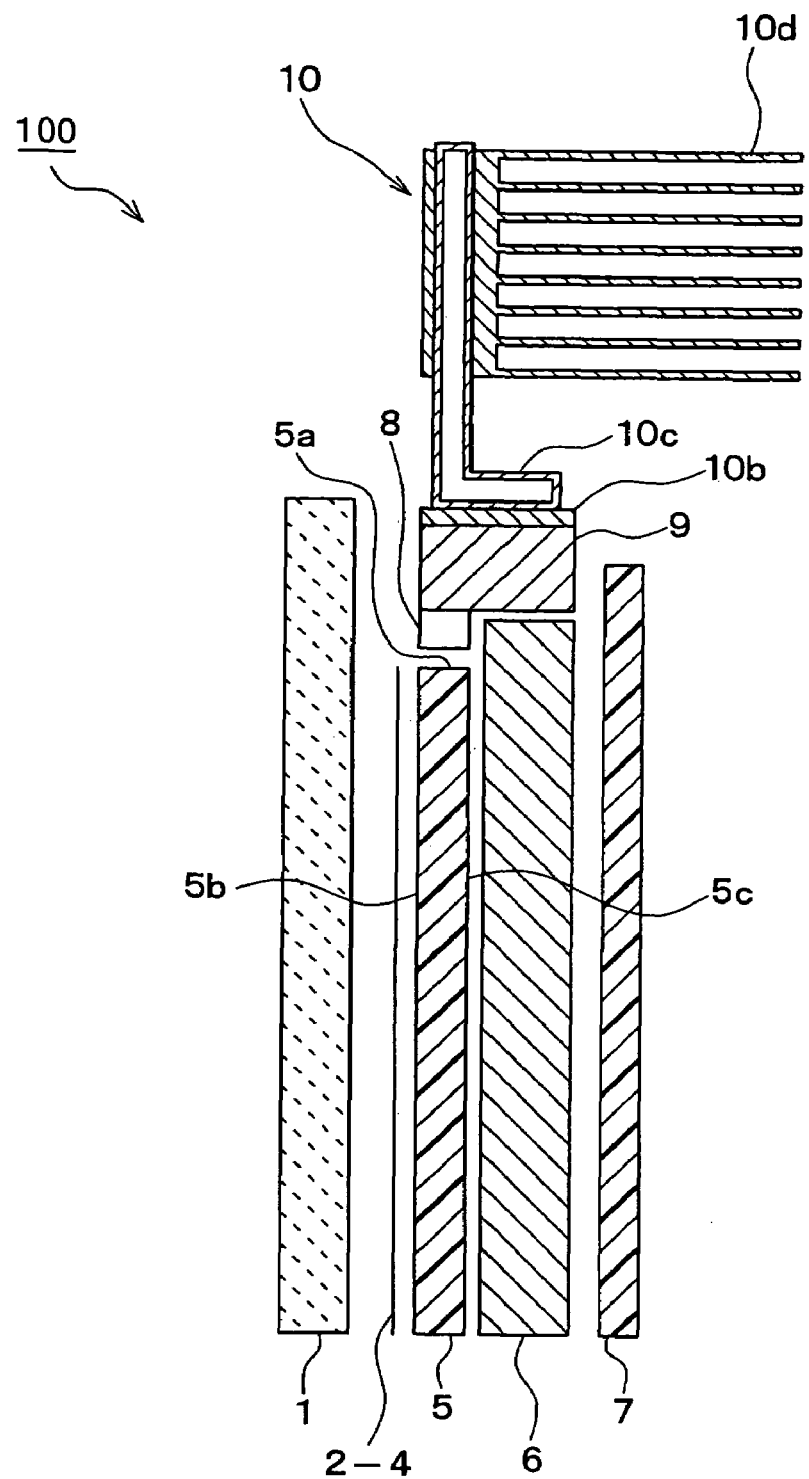
FIG. 3 is a horizontal cross sectional view showing the liquid crystal display apparatus of FIG. 2.

The diffusion sheet 4 diffuses light entering the diffusion sheet 4 through the back surface (i.e., from the right side of FIG. 3) and allows the diffused light to pass through to the front surface (i.e., to the left side of FIG. 3). Thus, light having uniform brightness is emitted from the entire front surface of the diffusion sheet 4 toward the liquid crystal panel 1.

The light guide panel 5 as the light waveguide path is a transparent panel made of acrylic, for example. The light guide panel 5 has a side surface (side edge) 5a, a front surface 5b, and a back surface 5c. Light is introduced into the light guide panel 5 through the side surface 5a and emitted through the front surface 5b. The emitted light is used as light for illuminating the liquid crystal panel 1.

Although the light guide panel 5 has four side surfaces (side edges) including the side surface 5a, light is introduced into the light guide panel 5 through only the side surface 5a. Alternatively, light may be introduced into the light guide panel 5 through both the side surface 5a and another side surface opposite to the side surface 5a.

The reflector panel 6 is disposed to come in close contact with the back surface 5c of the light guide panel 5. The reflector panel 6 reflects light that enters the light guide panel 5 through the side surface 5a and tries to exit the light guide panel 5 through the back surface 5c. Thus, the reflector panel 6 increases intensity of the light for illuminating the liquid crystal panel 1.

Figure 4:
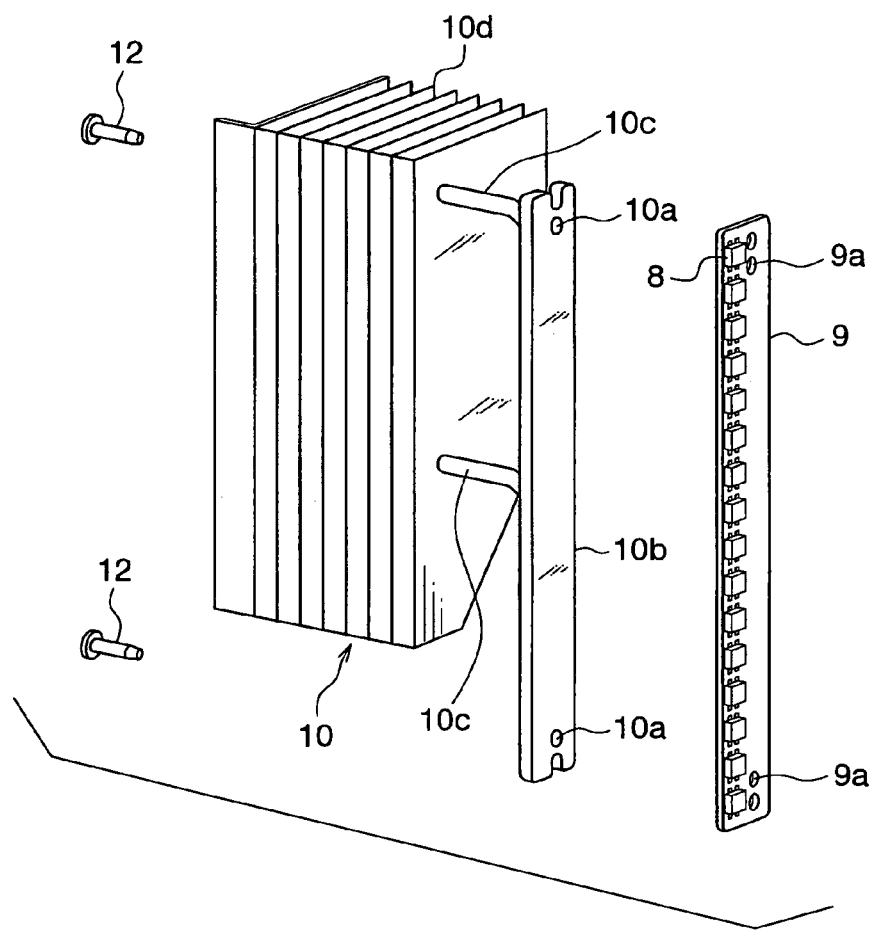
FIG. 4 is an enlarged view showing a cooling module of the liquid crystal display apparatus according to the first embodiment.
Figure 7:
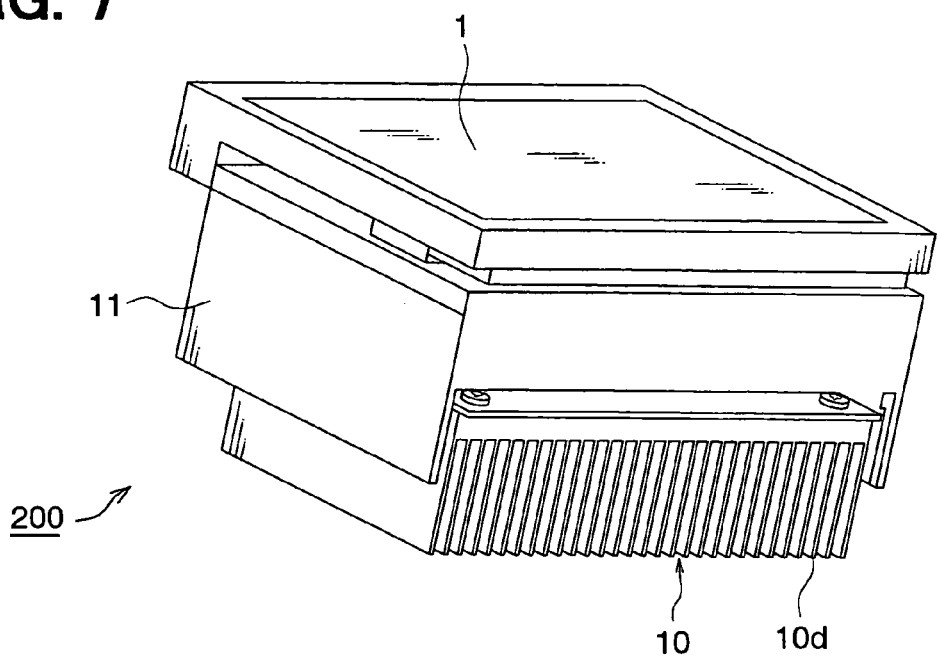
FIG. 7 is a perspective view showing the liquid crystal display apparatus according to the second embodiment.
Figure 5:
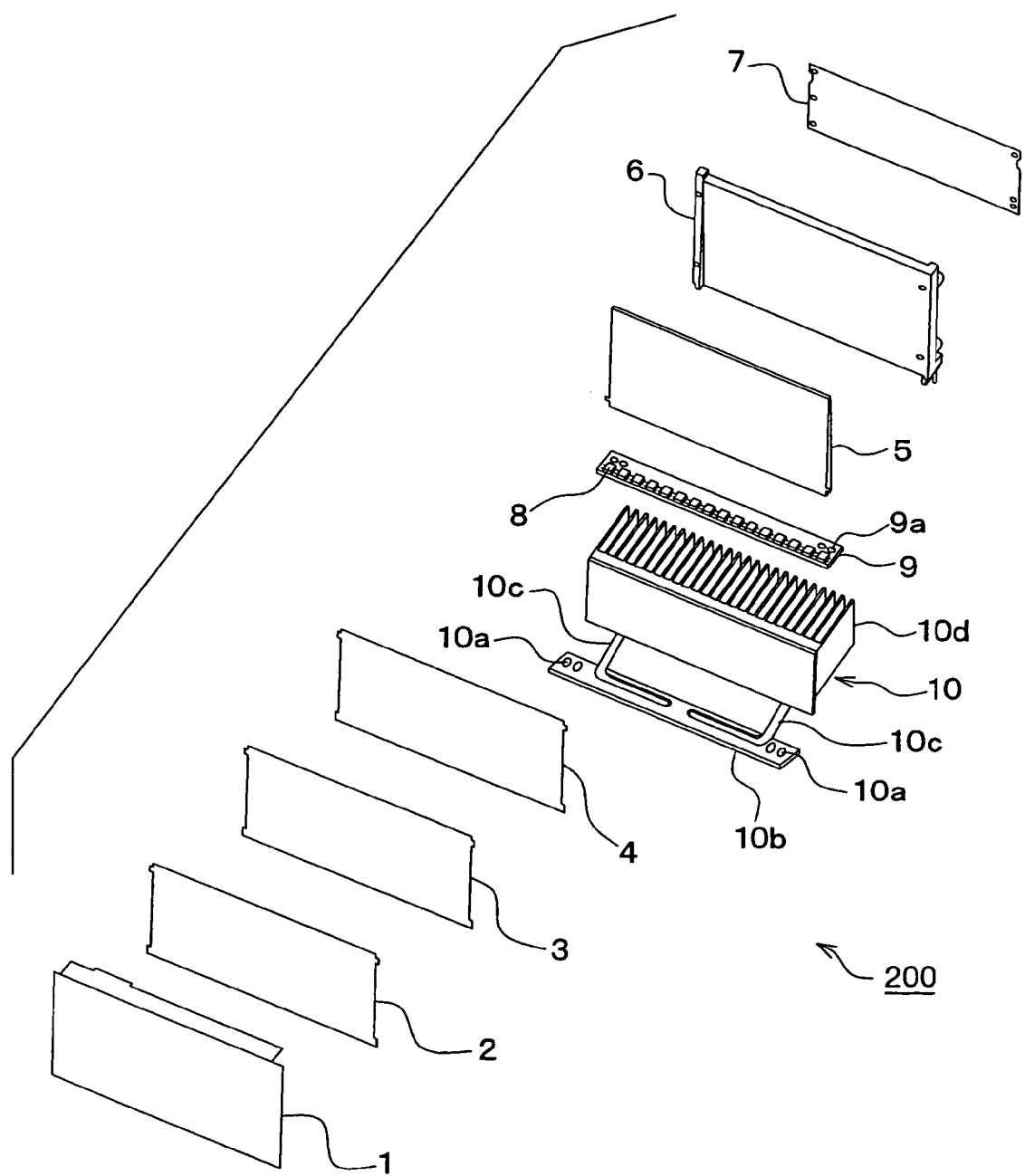
FIG. 5 is a disassembled perspective view showing a portion of a liquid crystal display apparatus according to a second embodiment of the present invention.

The reflector panel 6 also serves as a case for holding the optical sheets 2, 3, the diffusion sheet 4, and the light guide panel 5. The reflector panel 6 has one side surface to which the LED drive circuit 9 and the cooling module 10 are fixed. As shown in FIG. 4, the LED drive circuit 9 and the cooling module 10 have screw holes 9a and screw holes 10a, respectively, and are fixed to the reflector panel 6 by screws 12.

The circuit board 7 is disposed behind the reflector panel 6 and has various circuits for driving the LED apparatus 100. For example, the circuit board 7 has a liquid crystal drive circuit for driving the liquid crystal panel 1 and a LED control circuit for controlling timing of switching on and off of the LED 8 switched by the LED drive circuit 9.

A plurality of the LEDs 8 are arranged and mounted on the LED drive circuit 9 to face the side surface 5a of the light guide plate 5. The LEDs 8 are arranged on the LED drive circuit 9 in a top-bottom direction of FIG. 1. Each LED 8 is a vertical cavity surface emitting (VCSE) LED and emits light vertically with respect to the surface on which the LED 8 is mounted.

The LED drive circuit 9 has a semiconductor switching element for switching the LED 8 on and off. The LED 8 is mounted on a predetermined position of the LED drive circuit 9 to allow the semiconductor switching element to switch the LED 8 on and off.

The LED control circuit mounted on the circuit board 7 controls the semiconductor switching element of the LED drive circuit 9. The LED drive circuit 9 includes a rectangle aluminum substrate having an insulating film thereon. The LED drive circuit 9 is disposed on the insulating film. The aluminum substrate has the screw holes 9a at both end portions along the length thereof and is fixed to the refractor panel 6 by using the screws 12. Thus, the LED drive circuit 9 is fixed to the refractor panel 6 so that the LED 8 faces the side surface 5a of the light guide panel 5.

The cooling module 10 has an attachment plate 10b, a heat pipe 10c joined to the attachment plate 10b, and a heat release unit 10d connected to the attachment plate 10b through the heat pipe 10c.

The attachment plate 10b has a shape similar to that of the aluminum substrate of the LED drive circuit 9. The attachment plate 10b has the screw holes 10a at both end portions along the length thereof so that the attachment plate 10b can be fixed to the LED drive circuit 9 by using the screws 12. Thus, through the attachment plate 10b, the heat pipe 10c and the heat release unit 10d are fixed to the LED drive circuit 9. The attachment plate 10b may be, for example, made of aluminum.

The heat pipe 10c may be, for example, a copper pipe or a copper alloy pipe having high heat conductivity. The heat pipe 10c has an inner space and a coolant sealed in the inner space. For example, the coolant is water and occupies about 10% of the volume of the inner space. When heat generated by the LED drive circuit 9 is transferred to the heat pipe 10c through the attachment plate 10b, the heat pipe 10c absorbs and transports the transferred heat by using latent heat of condensation and vaporization of the coolant. Thus, the heat pipe 10c can transport a large amount of the heat from the LED drive circuit 9 to the heat release unit 10d with a small temperature difference.

Figure 2:
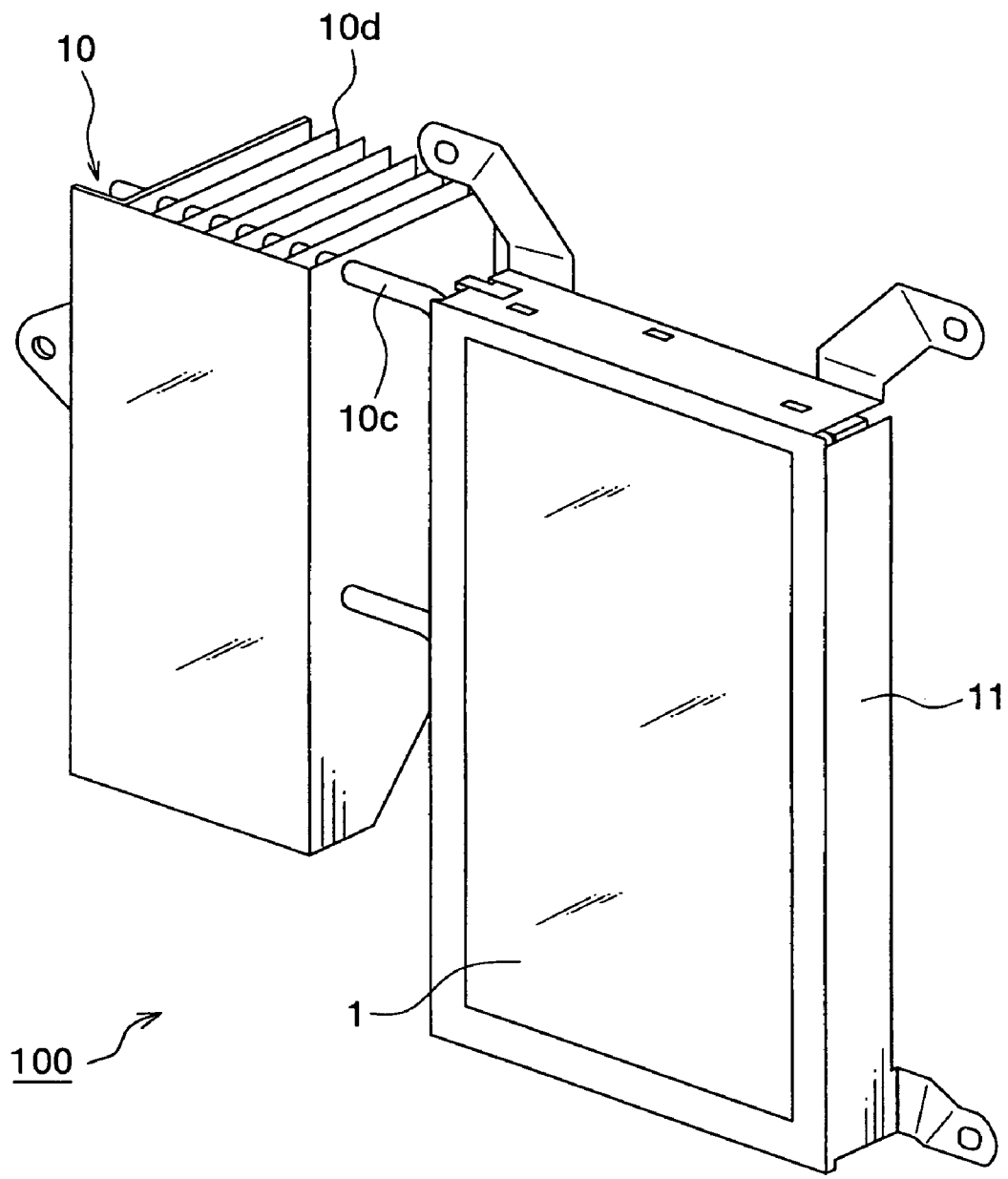
FIG. 2 is a perspective view showing the liquid crystal display apparatus according to the first embodiment.

The heat pipe 10c has one end portion jointed to the attachment plate 10b, for example, by welding. The heat pipe 10c extends horizontally as shown in FIG. 2 (upwardly in FIG. 3) from the attachment plate 10b. The other end portion of the heat pipe 10c extends into the heat release unit 10d. Thus, as shown in FIGS. 2 to 3, the heat release unit 10d is positioned on one side of the LCD apparatus 100.

The heat release unit 10d has multiple fins that are integrally constructed. Each fin has a hole (not shown) through which the heat pipe 10c passes. The heat pipe 10c comes into contact with every fin through the hole so that the heat release unit 10d can release heat effectively.

The fins extend in a vertical direction and are arranged parallel to each other. Thus, hot air heated by the fins easily escapes from the upper portion of the heat release unit 10d, and air convection easily occurs in the heat release unit 10d. The heat release unit 10d is disposed at or above a position where the light guide plate 5 and the circuit board 7 susceptible to heat are disposed.

In such approaches, the heat release unit 10d releases heat effectively and prevents hot air having the released heat from flowing to the light guide plate 5 and the circuit board 7.

Operations of the LCD apparatus 100 are described below.

When the LED drive circuit 9 and the LED control circuit mounted on the circuit board 7 drives the LEDs 8, the LEDs 8 emit light to the side surface 5a of the light guide panel 5. The emitted light is introduced into the light guide panel 5.

The introduced light is emitted through the front surface 5b of the light guide panel 5 to the diffusion sheet 4. Even if some of the introduced light tries to exits the light guide panel 5 through the back surface 5c in this time, the refractor panel 6 reflects the exiting light to the front surface 5b. The light emitted through the front surface 5b passes through the diffusion sheet 4, the optical sheets 2,3, and the liquid crystal panel 1. Thus, the display is performed on the liquid crystal panel 1, when the LCD drive circuit mounted on the circuit board 7 drives the liquid crystal panel 1.

Heat generated by the LED drive circuit 9 is transferred to the heat pipe 10c and then transported to the heat release unit 10d through the heat pipe 10c.

Specifically, the heat transferred to the heat pipe 10c evaporates the coolant stored in the heat pipe 10c, and then the coolant changes from liquid to gas by absorbing the heat. The gas coolant moves upwardly in the heat pipe 10c. Thus, the heat pipe 10c transports the heat from the LED drive circuit 9 to the heat release unit 10d for a short time. The gas coolant releases the heat at the heat release unit 10d.

The gas coolant is cooled and condensed into liquid coolant after releasing the heat. Then, the liquid coolant moves downwardly in the heat pipe 10c and is evaporated again by heat transferred to the heat pipe 10c. In such mechanisms, the heat generated by the LED drive circuit 9 can be effectively released.

In the LCD apparatus 100, the heat release unit 10d is coupled to the LED drive circuit 9 through the heat pipe 10c. In other words, the heat release unit 10d is indirectly connected to the LED drive circuit 9. Therefore, a large portion of the heat generated by the LED drive circuit 9 is transported to the heat release unit 10d without being released in the heat pipe 10c.

Thus, the heat pipe 10c prevents the heat generated by the LED drive circuit 9 from being released on the way to the heat release unit 10d. In the LCD apparatus 100, therefore, it is possible to prevent the heat from being transferred to the components such as the light guide plate 5 and the liquid crystal drive circuit of the circuit board 7, which are susceptible to heat and disposed near the LED drive circuit 9. Therefore, it is possible to prevent the heat from causing problems such as deformation of the light guide plate 5 and wrong display on the liquid crystal panel 1.

Further, in the LED apparatus 100, the attachment plate 10b joined to the heat pipe 10c is fixed to the LED drive circuit 9 by using the screws 12. In such an approach, the LED drive circuit 9 and the heat pipe 10c can be separately assembled into the LED apparatus 100. Even if there arises a need to replace the LED drive circuit 9 with another LED drive circuit, for example, in a service or a check, the LED drive circuit 9 can be replaced alone, not together with the heat pipe 10c. Therefore, the service or the check can be simplified.

Second Embodiment

A LCD apparatus 200 of the second embodiment will be now described with reference to FIGS. 5 to 8.

Figure 6A:
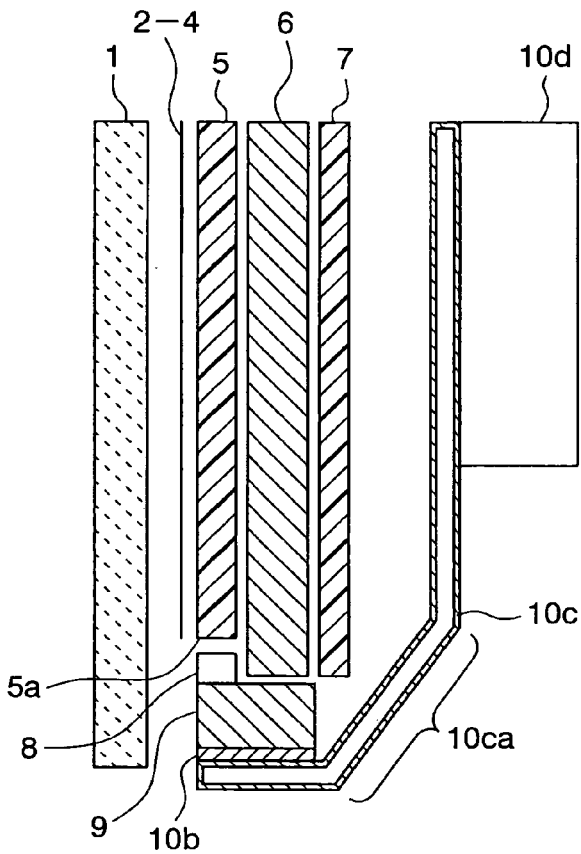
FIG. 6A and FIG. 6B are vertical cross sectional views showing a portion of a liquid crystal display apparatus of FIG. 5.

The LCD apparatus 200 has a structure basically similar to that of the LCD apparatus 100 according to the first embodiment. In the LCD apparatus 200, as shown in FIG. 6A, the LED drive circuit 9 is disposed on the bottom side of the LCD apparatus 200. The heat pipe 10c has one end portion joined to the LED drive circuit 9 through the attachment plate 10b and the other end portion extending to the heat release unit 10d. The heat pipe 10c is bent upwardly at a bent portion 10ca so that the other end portion of the heat pipe 10c is positioned behind the circuit board 7. Accordingly, the heat release unit 10d is disposed behind the circuit board 7.

Thus, the heat pipe 10c is disposed on the back side of the LCD apparatus 200 so that the heat release unit 10d can be disposed on the back side of the LCD apparatus 200. Even when the heat pipe 10c and the heat release unit 10d arranged as shown in FIGS. 5 to 8, the advantage described in the first embodiment can be obtained.

Figure 6B:
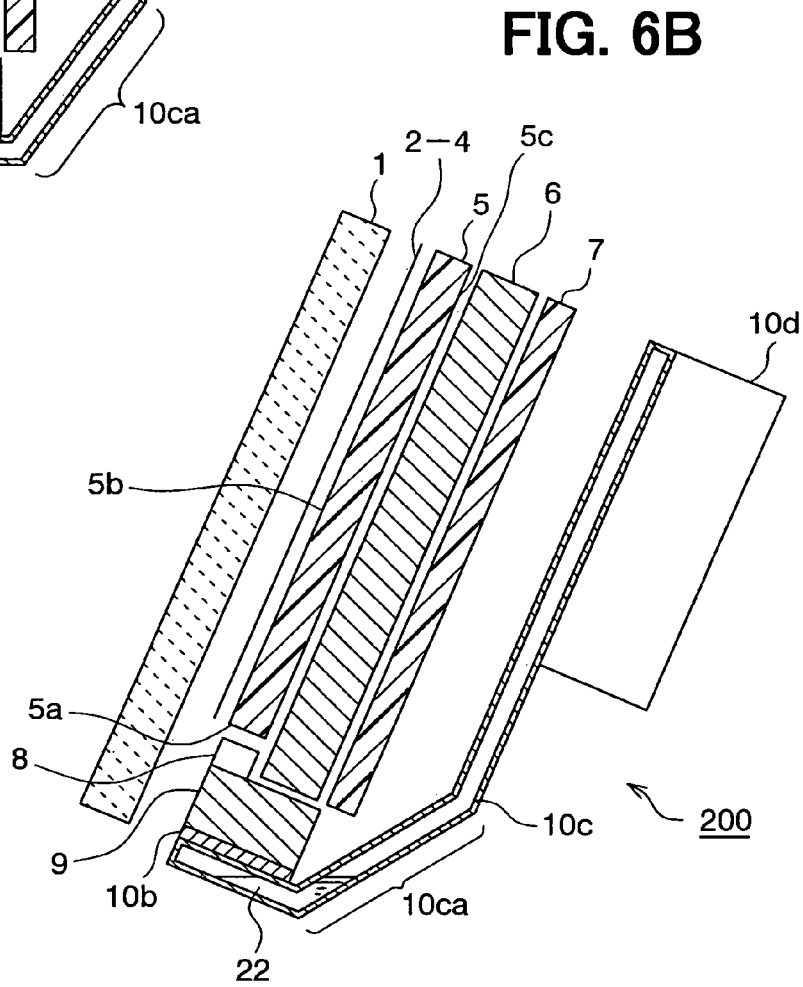
Figure 8:
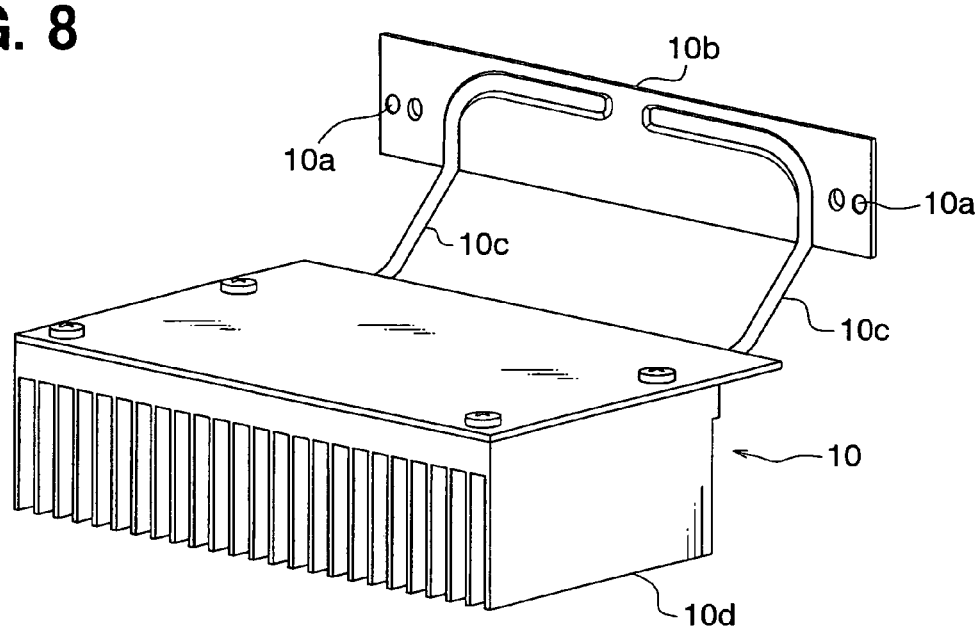
FIG. 8 is an enlarged view showing a cooling module of the liquid crystal display apparatus according to the second embodiment.

Another advantage of the apparatus 200 will be described with reference to FIG. 6B.

When ambient temperature of the LCD apparatus 200 drops below a freezing point of a coolant 22 sealed in the heat pipe 10c, the coolant 22 may freeze into solid and expand. For example, if the coolant 22 is water, the coolant 22 freezes at 0° C. In general, liquid freezes from top to bottom. Therefore, if the coolant 22 is trapped in the bottom of the heat pipe 10c, the trapped coolant 22 may apply expansion stress to the heat pipe 10c when freezing into solid. Repeated expansion stress may cause a crack in the heat pipe 10c.

In the LCD apparatus 200, the heat pipe 10c is bent upwardly at the bent portion 10ca that is positioned between two end portions of the heat pipe 10c. By tilting the LCD apparatus 200 as shown in FIG. 6B, at least a part of the bent portion 10ca of the heat pipe 10c can be positioned lower than the two end portions of the heat pipe 10c. Thus, the coolant 22 can be stored in the bent portion 10ca in normal times when no display is performed on LCD apparatus 200 (i.e., when the LED drive circuit 9 is not working).

In such an approach, even when the coolant 22 freezes into solid and expands, the expanding coolant 22 can escape to both the end portions of the heat pipe 10c. Therefore, the expansion stress applied to the heat pipe 10c can be prevented so that the crack caused in the heat pipe 10c can be prevented.

Figure 9:
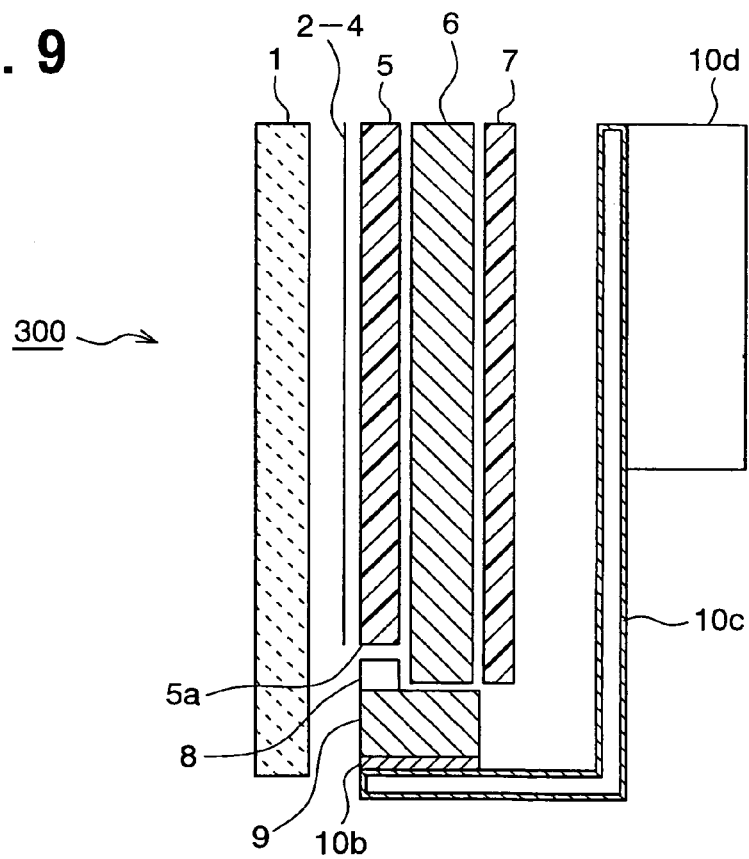
FIG. 9 is a vertical cross sectional view showing a liquid crystal display apparatus of a modification of the second embodiment.

FIG. 9 shows a LCD apparatus 300 according to a modification of the second embodiment.

In the LCD apparatus 300, the heat pipe 10c is bent upwardly from the bottom portion without the bent portion 10ca.

Third Embodiment

Figure 10:
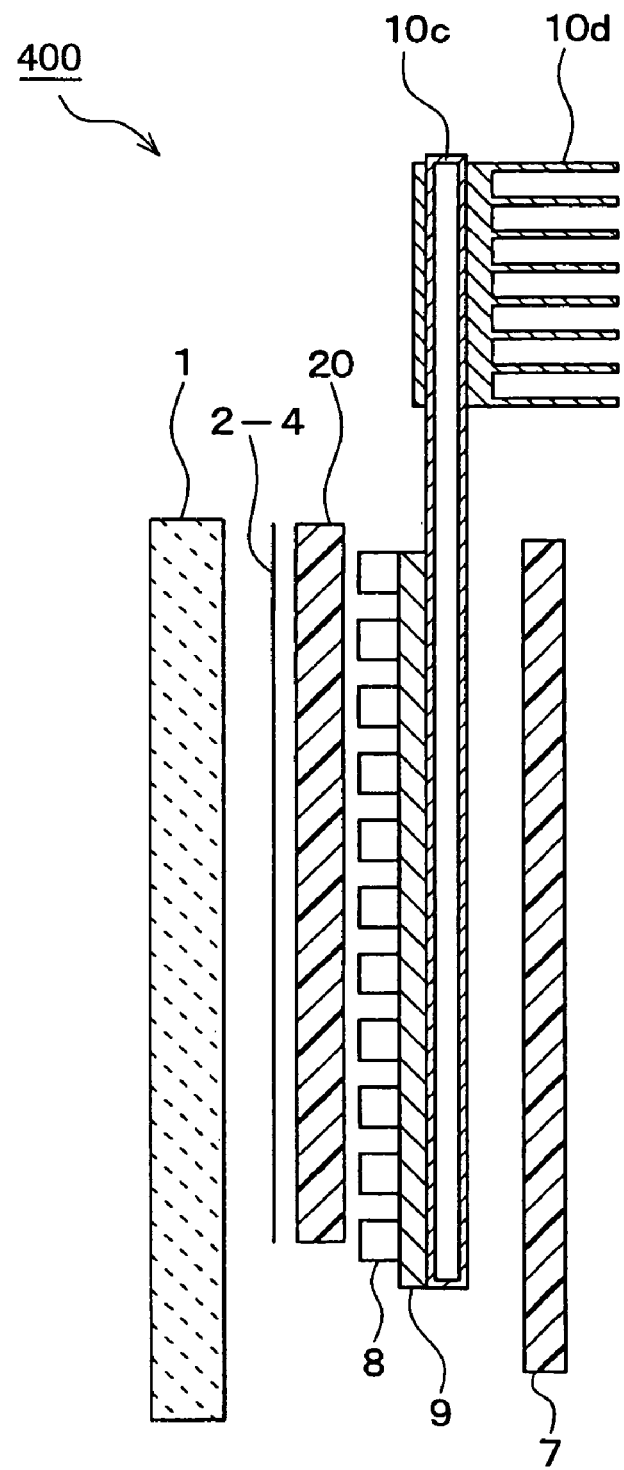
FIG. 10 is a horizontal cross sectional view showing a portion of a liquid crystal display apparatus according to a third embodiment of the present invention.
Figure 11:
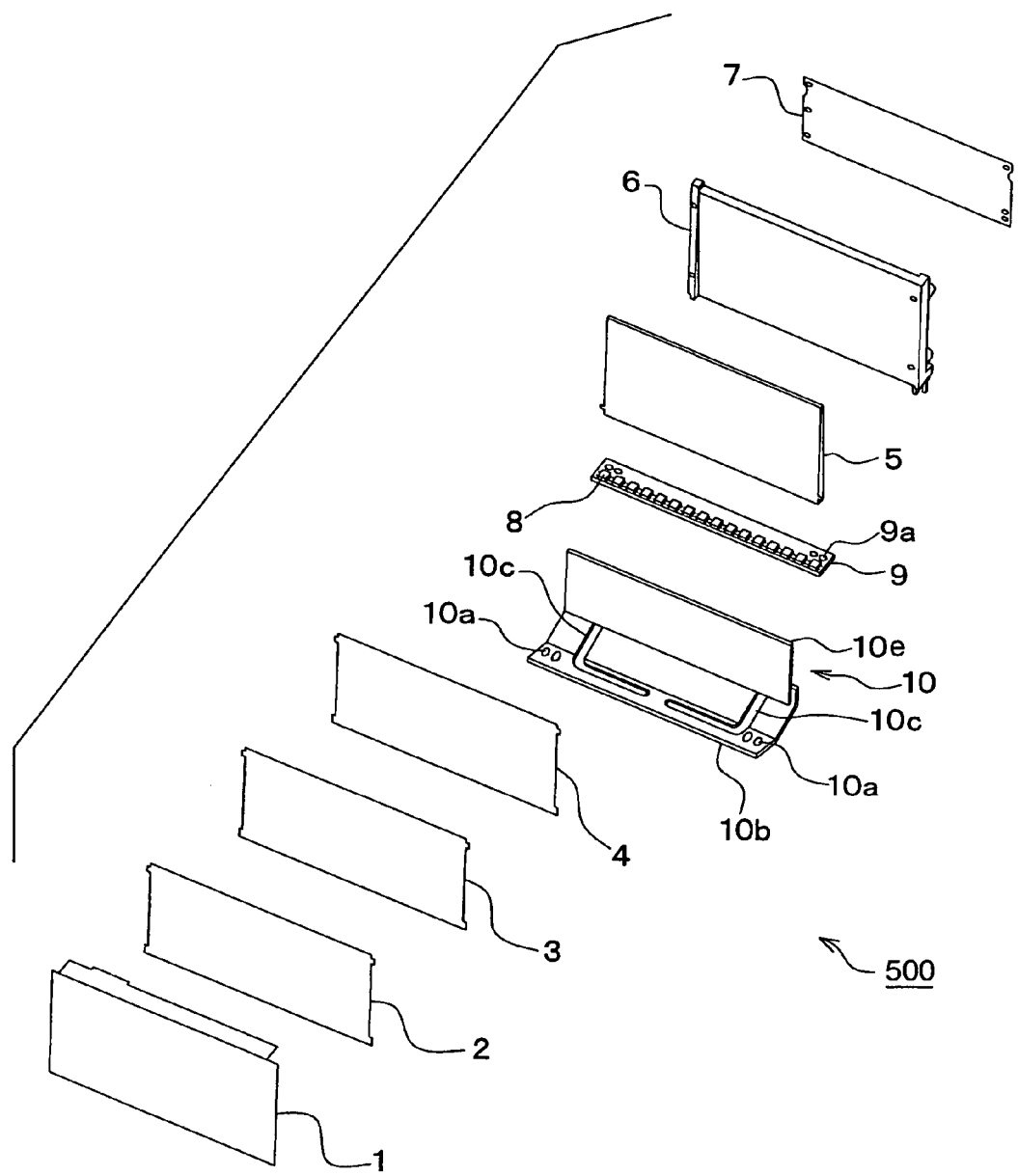
FIG. 11 is a disassembled perspective view showing a portion of a liquid crystal display apparatus according to a fourth embodiment of the present invention.

A LCD apparatus 400 of the third embodiment will be now described with reference to FIG. 10.

The LCD apparatus 400 has a structure basically similar to that of the LCD apparatus 100 according to the first embodiment. In the LCD apparatus 400, a light permeable panel 20 is disposed instead of the light guide panel 5, and the LED drive circuit 9 is disposed behind the light permeable panel 20. The LED 8 is mounted on one surface of the aluminum substrate of the LED drive circuit 9 to face the light permeable panel 20.

The light permeable panel 20 acts as the light waveguide path. Light emitted by the LED 8 is emitted to the liquid crystal panel 1 after passing through the light permeable panel 20. Therefore, the display appears on the liquid crystal panel 1.

In the LCD apparatus 400, the heat pipe 10c has one end portion disposed along the back surface of the LED drive circuit 9 and the other end portion projecting horizontally from the LED drive circuit 9 into the heat release unit 10d. Thus, the heat release unit 10d is positioned on one side of the LCD apparatus 400.

Fourth Embodiment

A LCD apparatus 500 of the fourth embodiment will be now described with reference to FIGS. 11 to 14.

The LCD apparatus 500 has a structure basically similar to that of the LCD apparatus 200 according to the second embodiment. In the LCD apparatus 500, the cooling module 10 has an attachment plate 10b, a heat pipe 10c, and a heat release plate 10e instead of the heat release unit 10d.

The attachment plate 10b includes a first portion and a second portion. The first portion has a shape basically similar to that of the aluminum substrate of the LED drive circuit 9. The second portion extends upwardly from the first portion to the heat release plate 10e. Therefore, the attachment plate 10b is formed such that a single plate is bent between the first portion and the second portion. The second portion of the attachment plate 10b has the screw holes 10a at both end portions along the length thereof so that the attachment plate 10b can be fixed to the LED drive circuit 9 by using the screws 12. The attachment plate 10b has a groove for holding the heat pipe 10c.

Figure 12:
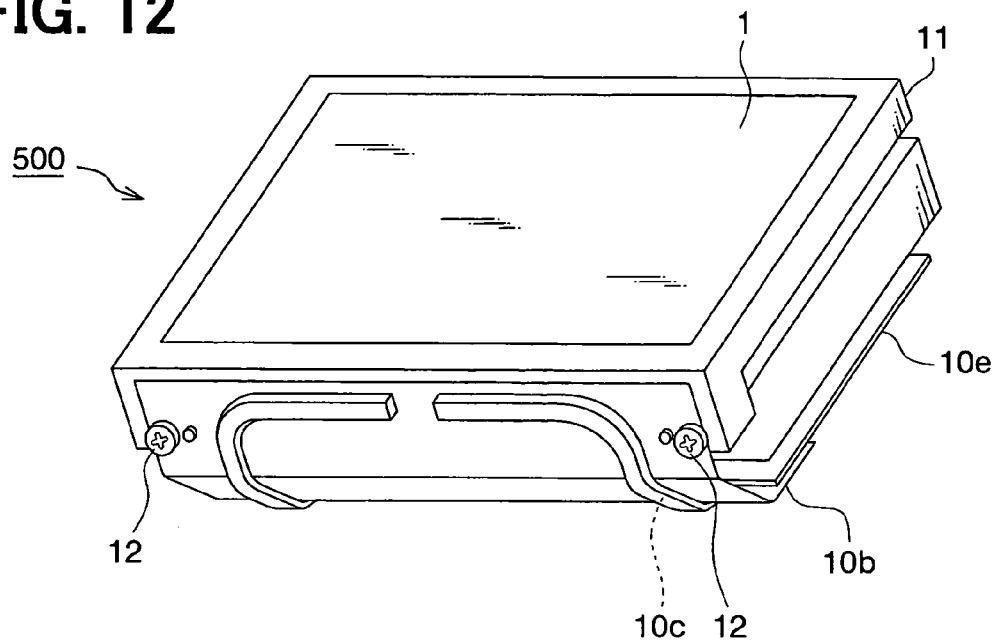
FIG. 12 is a perspective view showing the liquid crystal display according to the fourth embodiment.
Figure 13:
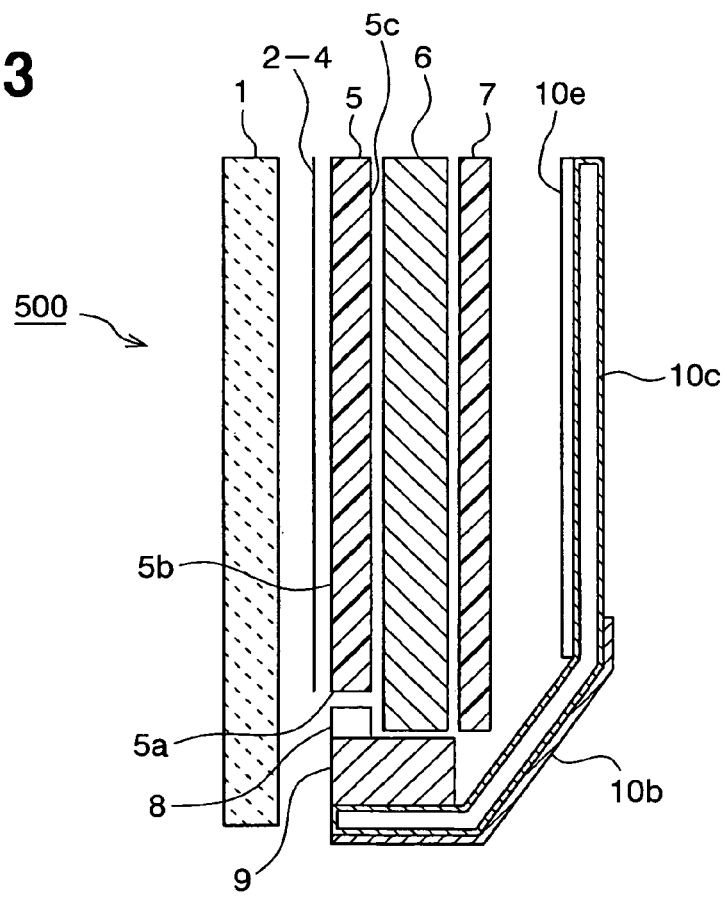
FIG. 13 is a vertical cross sectional view showing a portion of the liquid crystal display apparatus of FIG. 12.
Figure 14:
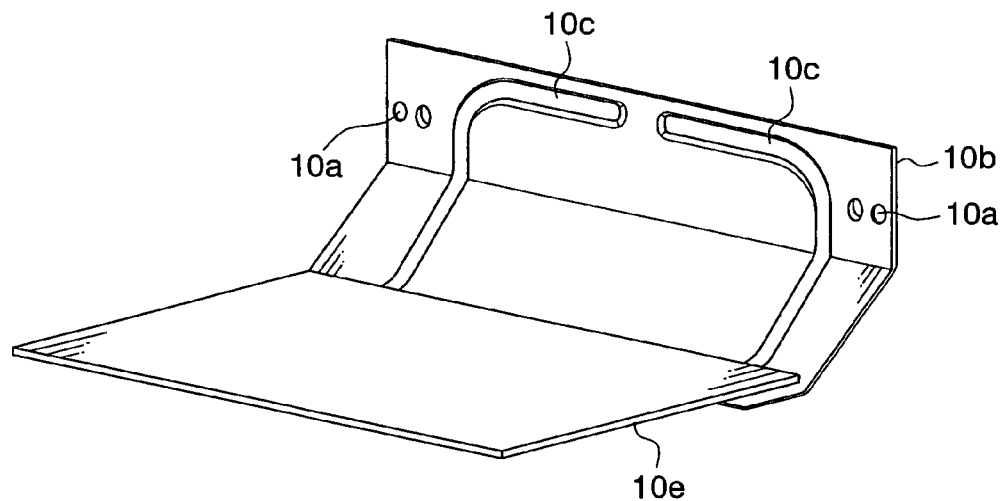
FIG. 14 is an enlarged view showing a cooling module of the liquid crystal display apparatus according to the fourth embodiment.

The heat pipe 10c has one end portion fixed to the first portion of the attachment plate 10b and the other end portion extending to the heat release plate 10e. Thus, the heat pipe 10c is disposed along the attachment plate 10b and the heat release plate 10e. As shown in FIG. 12 and FIG. 14, the heat pipe 10c is fitted into the groove of the attachment plate 10b.

The heat release plate 10e is disposed behind the circuit board 7 and comes into contact with the heat pipe 10c. The heat release plate 10e is made of a material having high heat conductivity or high heat release rate so that the heat release plate 10e can conduct or release heat quickly. For example, the heat release plate 10e is made of aluminum. In conjunction with the cover 11 shown in FIG. 12, the attachment plate 10b and the heat release plate 10e provide a case of the LCD apparatus 500.

The attachment plate 10b and the heat release plate 10e are separate members so as to be made of different materials. For example, the attachment plate 10b is made of a material having high heat conductivity and the heat release plate 10e is made of a material having high heat release rate. Alternatively, the attachment plate 10b and the heat release plate 10e may be made of the same material.

The attachment plate 10b and the heat release plate 10e operate basically similar to that of the heat release unit 10d. Heat generated by the LED drive circuit 9 is transported to the attachment plate 10b and the heat release plate 10e through the heat pipe 10c. As described above, the heat pipe 10c can transport the heat for a short time. Therefore, a large portion of the heat is released at the heat release plate 10e, which is disposed kept away from the LED drive circuit 9.

Thus, the heat pipe 10c prevents the heat from being transferred to the components such as the light guide plate 5 and the liquid crystal drive circuit of the circuit board 7, which are susceptible to heat and disposed near the LED drive circuit 9.

In the LCD apparatus 500, therefore, it is possible to prevent the heat from causing problems such as deformation of the light guide plate 5 and the wrong display appearing on the liquid crystal panel 1.

Further, the attachment plate 10b and the heat release plate 10e provide the case of the LCD apparatus 500 so that a component used for the case can be eliminated. Therefore, the number of components of the LCD apparatus 500 can be reduced.

Fifth Embodiment

Figure 15:
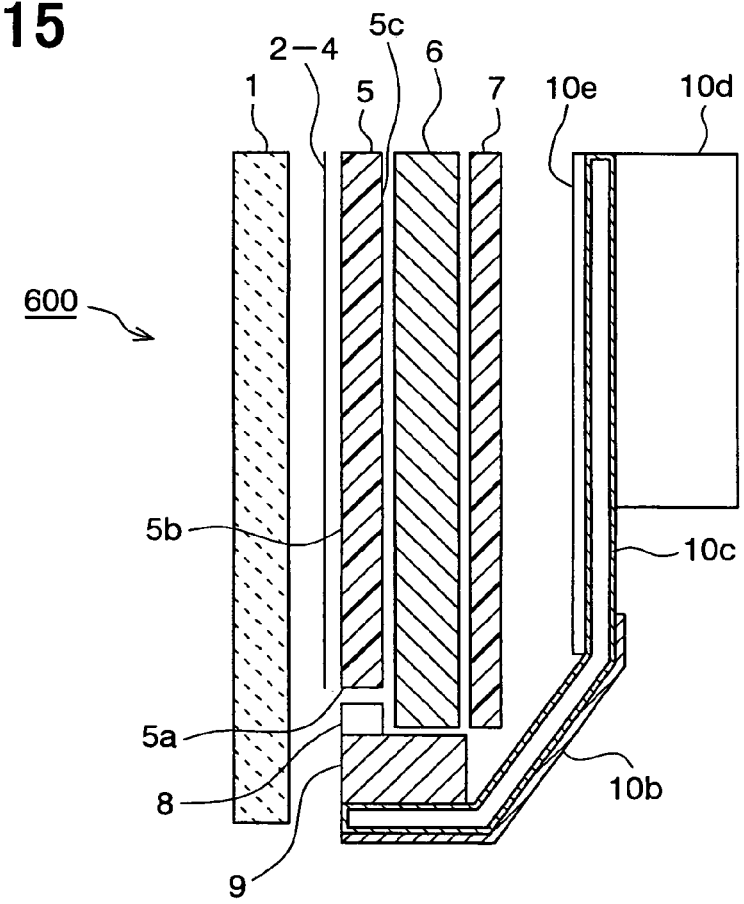
FIG. 15 is a vertical cross sectional view showing a portion of a liquid crystal display apparatus according to a fifth embodiment of the present invention.
Figure 16:
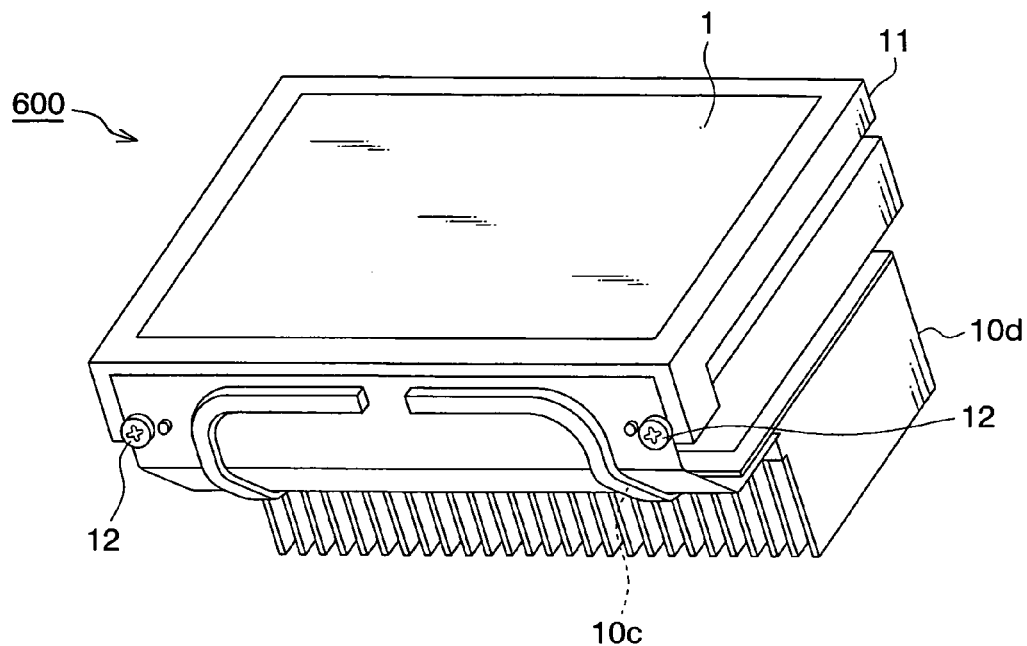
FIG. 16 is a perspective view showing the liquid crystal display according to the fifth embodiment.
Figure 17:
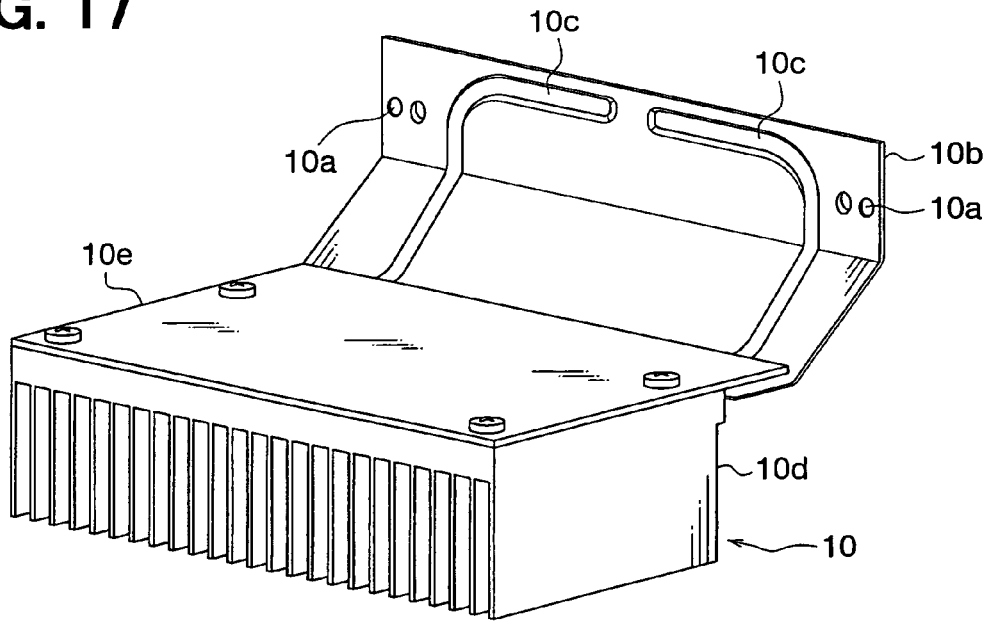
FIG. 17 is an enlarged view showing a cooling module of the liquid crystal display apparatus according to the fifth embodiment.

A LCD apparatus 600 of the fifth embodiment will be now described with reference to FIGS. 15 to 17.

The LCD apparatus 600 has a structure basically similar to that of the LCD apparatus 500 according to the fourth embodiment. In the LCD apparatus 600, the cooling module 10 has the heat release unit 10d in addition to heat release plate 10e, thereby releasing heat generated by the LED drive circuit 9 more effectively. The heat release unit 10d has a structure similar to that of the second embodiment.

Sixth Embodiment

A LCD apparatus 700 of the sixth embodiment will be now described with reference to FIG. 18.

The LCD apparatus 700 has a structure basically similar to that of the LCD apparatus 500 according to the fourth embodiment. In the LCD apparatus 700, the light permeable panel 20 is disposed instead of the light guide panel 5, and the LED drive circuit 9 is disposed behind the light permeable panel 20. The LEDs 8 are mounted on one surface of the aluminum substrate of the LED drive circuit 9 to face the light permeable panel 20.

Figure 18:
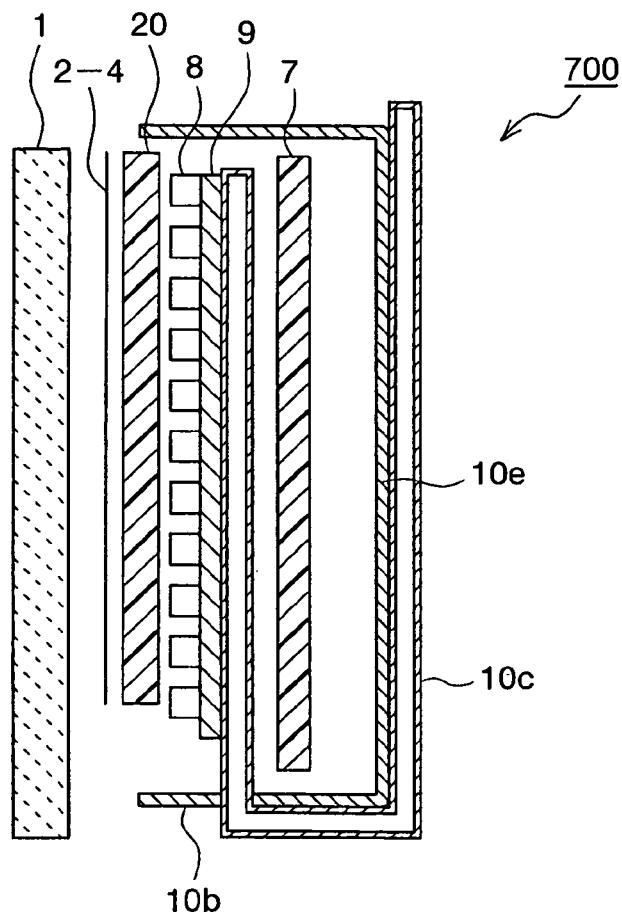
FIG. 18 is a vertical cross sectional view showing a portion of a liquid crystal display apparatus according to a sixth embodiment of the present invention.
Figure 20:
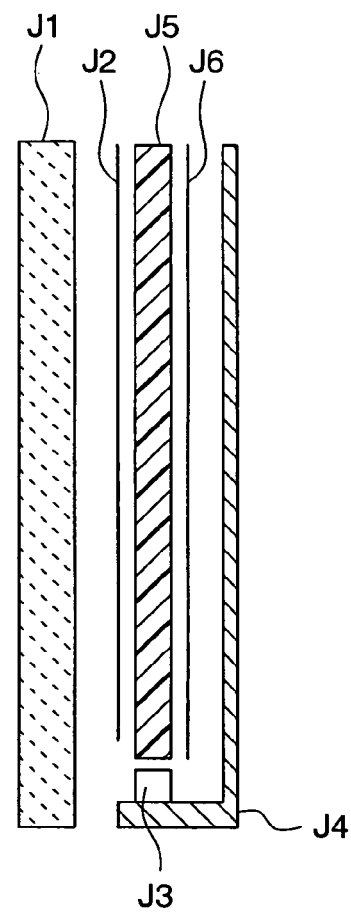
FIG. 20 is a horizontal cross sectional view showing a portion of a liquid crystal display apparatus according to a prior art.

A heat pipe 10c is formed into approximately U-shape in cross section as shown in FIG. 18. The heat pipe 10c has a first portion extending along the back surface of the LED drive circuit 9, a second portion extending along the attachment plate 10b, and a third portion extending along the heat release plate 10e.

Seventh Embodiment

Figure 19:
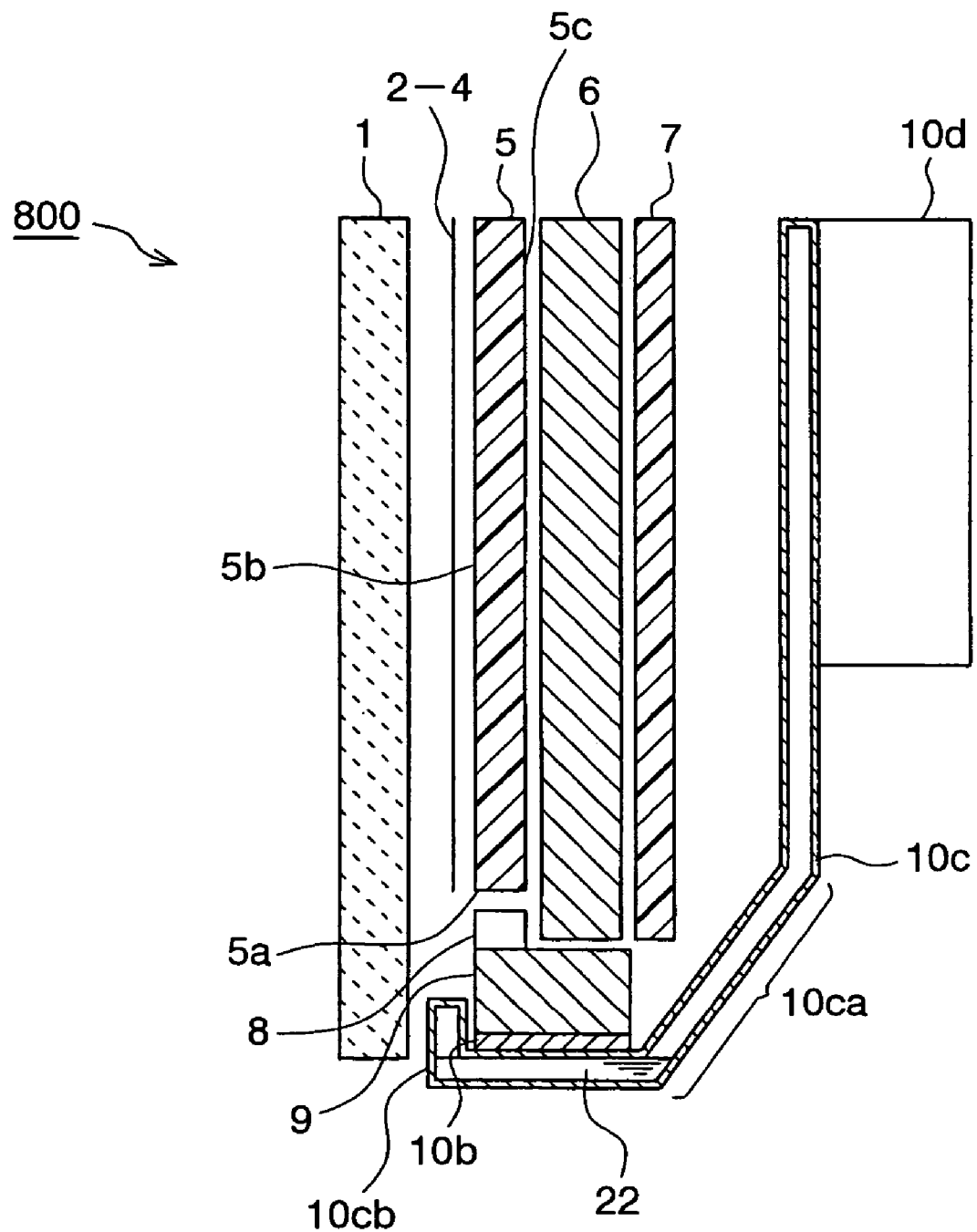
FIG. 19 is a vertical cross sectional view showing a portion of a liquid crystal display apparatus according to a seventh embodiment of the present invention.

A LCD apparatus 800 will be now described with reference to FIG. 19.

The LCD apparatus 800 has a structure basically similar to that of the LCD apparatus 200 according to the second embodiment. In the LCD apparatus 800, the heat pipe 10c is extended on the front side of the LED drive circuit 9. The extended portion is bent upwardly to provide an escape portion 10cb.

The heat pipe 10c has the escape portion 10cb so that the coolant 22 is stored between the bent portion 10ca and the escape portion 10cb in the normal times.

Even when the coolant 22 freezes into solid and expands, the expanding coolant 22 can escape to both the bent portion 10ca and the escape portion 10cb. Thus, the heat pipe 10c can be prevented from being damaged by the coolant 22, when the coolant 22 freezes.

Other Embodiments

The above embodiments may be modified in various ways.

The heat release unit 10d may be disposed anywhere, as long as the heat release unit 10d is disposed physically kept away from the light guide plate 5 and the circuit board 7.

A high heat conductive member such as a metal board, a carbon sheet stuck to an aluminum board, and conductive resin may be used as the heat transport member, instead of or in addition to the heat pipe 10c.

The LED 8 may be mounted on a metal substrate different from the aluminum substrate on which the LED drive circuit 9 is disposed. In this case, the heat pipe 10c is connected to the metal plate to transport heat generated by the LED 8.

Such changes and modifications are to be understood as being within the scope of the present invention as defined by the appended claims.

What is claimed is:

1. A liquid crystal display apparatus comprising:
 a liquid crystal member for performing a display;
 a light source for emitting a light;
 a light guide plate for guiding the light emitted by the light source to the liquid crystal member, the light guide plate being disposed behind the liquid crystal member;
 a circuit board having a liquid crystal display circuit for driving the liquid crystal member;
 a light source drive circuit for switching the light source on and off;
 a heat release member for releasing a heat generated by the light source drive circuit, the heat release member being spaced from the liquid crystal member to provide a predetermined space therebetween; and
 a heat transport member having a heat conductivity higher than the heat release member, the heat transport member being disposed in said predetermined space, wherein
 the heat release member is connected through the heat transport member to the light source drive circuit.

2. The apparatus according to claim 1, wherein
 the heat transport member has an extension portion extending to a predetermined position next to or behind the liquid crystal member, and
 the heat release member is connected to the extension portion of the heat transport member to be disposed at the predetermined position.

3. The apparatus according to claim 1, wherein the heat release member is disposed at or above a position where the light guide plate and the circuit board are disposed.

4. The apparatus according to claim 1, wherein the heat transport member is constructed with at least one of a heat pipe, a metal plate, and a conductive member having a carbon sheet or resin.

5. The apparatus according to claim 1, wherein
 the heat release member includes a heat release plate disposed behind the liquid crystal member and the light guide plate,
 the heat release plate is provided to form a part of a case for protecting at least the light guide plate, and
 the heat transport member is disposed along the case to contact the heat release plate.

6. The apparatus according to claim 1, wherein
 the heat transport member is a heat pipe for transporting the heat to the heat release member, the heat pipe having a heat conductivity higher than the heat release member, wherein
 the heat pipe has a first end portion bent upwardly and connected to the heat release member, and a second end portion disposed below the first end portion and connected to the light source drive circuit.

7. The apparatus according to claim 6, wherein
 the heat pipe is sealed with a liquid medium,
 the second end portion of the heat pipe is bent upwardly, and the liquid medium is positioned in a portion between the first and second end portions of the heat pipe.

8. The liquid crystal display apparatus according to claim 1, further comprising:
a cover for housing the liquid crystal member therein, wherein
the heat release member is disposed outside the cover.

9. A liquid crystal display apparatus comprising:
a liquid crystal member for performing a display;
a light source for emitting a light;
a light guide plate for guiding the light emitted by the light source to the liquid crystal member, the light guide plate being disposed behind the liquid crystal member;
a circuit board having a liquid crystal display circuit for driving the liquid crystal member;
a light source drive circuit for switching the light source on and off;
a heat release member for releasing a heat generated by the light source, the heat release member being spaced from the liquid crystal member to provide a predetermined space therebetween;
a heat transport member having a heat conductivity higher than the heat release member, the heat transport member being disposed in said predetermined space, wherein
the heat release member is connected through the heat transport member to the light source.

10. The apparatus according to claim 9, wherein
the heat release member includes a heat release plate disposed behind the liquid crystal member and the light guide plate,
the heat release plate is provided to form a part of a case for protecting at least the light guide plate, and
the heat transport member is disposed along the case to contact the heat release plate.

11. The apparatus according to claim 9, wherein the heat transport member is a heat pipe for transporting the heat to the heat release member, the heat pipe having a heat conductivity higher than the heat release member, wherein
the heat pipe has a first end portion bent upwardly and connected to the heat release member, and a second end portion disposed below the first end portion and connected to the light source.

12. The apparatus according to claim 11, wherein
the heat pipe is sealed with a liquid medium,
the second end portion of the heat pipe is bent upwardly, and
the liquid medium is positioned in a portion between the first and second end portions of the heat pipe.

13. The liquid crystal display apparatus according to claim 9, further comprising:
a cover for housing the liquid crystal member therein, wherein
the heat release member is disposed outside the cover.

14. A liquid crystal display apparatus comprising:
a liquid crystal member for performing a display;
a light source for emitting a light;
a light guide plate for guiding the light emitted by the light source to the liquid crystal member, the light guide plate being disposed behind the liquid crystal member;
a circuit board having a liquid crystal display circuit for driving the liquid crystal member;
a light source drive circuit for switching the light source on and off;
a heat release member for releasing a heat generated by the light source drive circuit, the heat release member being spaced from the liquid crystal member to provide a predetermined space therebetween; and
a heat transport member having a heat conductivity higher than the heat release member, the heat transport member being disposed in said predetermined space, wherein
the heat release member is connected through the heat transport member to the light source drive circuit, and
the heat release member has a plurality of fins which are arranged parallel to each other to be spaced apart from each other and extend in a vertical direction.

15. A liquid crystal display apparatus comprising:
a liquid crystal member for performing a display;
a light source for emitting a light;
a light guide plate for guiding the light emitted by the light source to the liquid crystal member, the light guide plate being disposed behind the liquid crystal member;
a circuit board having a liquid crystal display circuit for driving the liquid crystal member;
a light source drive circuit for switching the light source on and off;
a heat release member for releasing a heat generated by the light source drive circuit; and
a heat transport member having a heat conductivity higher than the heat release member, wherein
the heat release member is connected to the light source drive circuit at a position separated from the light source drive circuit, and
the heat release member has a plurality of fins which are arranged parallel to each other to be spaced apart from each other and extend in a vertical direction.

* * * * *